United States Patent Office 3,474,306
Patented Oct. 21, 1969

3,474,306

MODULAR UNIT FOR APPLYING PRESSURE BETWEEN ELECTRICAL CONTACTS AND SEMICONDUCTOR CELLS

Herbert Vogt, Munich, Germany, assignor to Siemens Aktiengesellschaft, Berlin, Germany, a corporation of Germany Filed June 8, 1967, Ser. No. 644,567
Claims priority, application Germany, June 10, 1966, S 104,216; Mar. 14, 1967, S 108,799
Int. Cl. H01l *1/16, 5/00*
U.S. Cl. 317—234 22 Claims

ABSTRACT OF THE DISCLOSURE

A pair of semiconductor cells are housed in coaxial relation with an electrical contact surface of each of the cells in electrical contact with a corresponding one of the sides of the central arm of an electrically conductive holder of substantially H-shaped cross section. The housing areas have dimensions lateral to the axis of the cells greater than the corresponding dimensions of each of the cells and slightly less than the dimension of each cell in the direction of the axis. A second electrical contact surface of each cell is positioned respectively outside the housing areas. The cells are movable from positions in planes perpendicular to the axis into planes slightly inclined relative thereto whereby the cells are freely shiftable out of coaxial position in the housing areas in a predetermined range of movement.

Description of the invention

The present invention relates to a modular unit for applying pressure between electrical contacts and semiconductor cells. More particularly, the invention relates to a modular unit for applying pressure between a pair of electrical contacts and a pair of semiconductor cells.

The semiconductor cells are identical, each having determined dimensions and a first and a second electrical contact surface spaced from and substantially parallel to each other. Each semiconductor cell comprises a monocrystalline semiconductor body having at least one p–n junction.

In a modular unit of the type of the present invention, it is essential that adequate thermal and electrical contact be provided between the contact surfaces of the semiconductor cells and a pair of electrically conductive contact members which clamp the semiconductor cells between them. Adequate thermal and electrical conductivity is provided by a pressure of between 100 and 500 kg./cm.$^2$ on the abutting or contacting surfaces of the semiconductor cells and the contact members. Modular units of the type of the present invention comprise a plurality of holders, each of which houses a pair of semiconductor cells. The holders are clamped between a pair of spaced contact members. Such known units are of complex construction and are therefore expensive to manufacture, since they must be designed in a manner whereby each of the semiconductor cells is subjected to stress only due to direct pressure and not due to shearing or bending. This necessitates the positioning of the contact members and of any cooling members which may be positioned between the semiconductor cells, as well as the contact surfaces of said semiconductor cells, in exact parallel relation to each other. It also necessitates the uniform distribution over the entire contact surfaces of the semiconductor cells of any pressure which is produced during the assembly of the modular unit and which reaches said semiconductor cells. It has therefore been impossible, prior to the present invention, to provide the necessary contact surface pressure to two or more semiconductor cells positioned in axial relationship between interconnected spaced resilient members.

The principal object of the present invention is to provide a new and improved modular unit for applying pressure between electrical contacts and semiconductor cells. The modular unit of the present invention overcomes the disadvantages of similar modular units of the prior art. The modular unit of the present invention provides suitable and uniform pressure between the electrical contacts and the semiconductor cells without disadvantage. The modular unit of the present invention provides either a series circuit connection or a parallel for center point circuit connection and provides complete protection of all electrical contacts and the semiconductor cells against atmospheric influences. The modular unit of the present invention is simple, but sturdy in structure and is inexpensive to manufacture. The modular unit of the present invention prevents the application of undesirable pressure between the electrical contacts and the semiconductor cells. The modular unit of the present invention provides desirable heat and current transfer characteristics between the electrical contacts and the semiconductor cells. The modular unit of the present invention functions with efficiency, effectiveness and reliability. A plurality of modular units of the present invention may be combined into a single modular unit of simple, but compact and effective structure. The multiple modular unit of the present invention may function as a single phase rectifier or as a three phase rectifier.

In accordance with the present invention, a modular unit applies pressure between a pair of electrical contacts and a pair of semiconductor cells. The semiconductor cells are substantially identical. Each of the semiconductor cells has determined dimensions and a first and a second electrical contact surface spaced from and substantially parallel to each other. The modular unit comprises an electrically conductive holder of substantially H-shaped cross section having a first arm and a second arm spaced from and substantially parallel to each other and a central arm extending between and joined to the central area of each of the first and second arms and substantially perpendicular thereto. The central arm has an axis through its center parallel to and equidistant from the first and second arms. The central arm and substantially one-half of each of the first and second arms encloses three sides of a first area on one side of the central arm and the central arm and substantially the other half of each of the first and second arms enclose three sides of a second area on the other side of the central arm. Each of the first and second areas houses a corresponding one of the pair of semiconductor cells in substantially coaxial relation with the first electrical contact surface of each of the semiconductor cells in electrical contact with a corresponding one of the sides of the central arm and has dimensions slightly greater than the corresponding determined dimensions of each of the semiconductor cells with the exception of the axial dimension of which that of each semiconductor cell is greater than that of each area. The second electrical contact surface of each of the semiconductor cells is positioned outside a corresponding one of the first and second areas. The corresponding dimensions of the first and second areas and the semiconductor cells are related to each other in a manner whereby the semiconductor cells are freely shiftable out of a coaxial position in the corresponding first and second areas in a predetermined range of movement. A pair of electrically conductive contact members is in substantially coaxial relation with and clamps and encloses the holder between them. Each of the contact members has a contact surface electrically contacting the second electrical contact surface of a corresponding one of the semiconductor cells.

The open side of each of the first and second areas is smaller in area than the corresponding side of the corresponding semiconductor cell and larger in area than the corresponding contact surface of the corresponding contact member. One of a side of the central arm and a contact surface of the contact members is of convex configuration relative to the corresponding electrical contact surface of the corresponding semiconductor cell. One of a side of the central arm and a contact surface of the contact members may be of substantially spherical configuration relative to the corresponding electrical contact surface of the corresponding semiconductor cell. A pair of substantially annular members of elastic electrically insulating material are provided and are each interposed between a corresponding end of each of the first and second arms of the holder and a corresponding one of the contact members. The ends of the first and second arms of the holder are bent in a manner whereby they extend toward each other for a small distance substantially parallel to the central arm of the holder. The second electrical contact surface of each of the semiconductor cells is outside the corresponding one of the first and second areas. Each of the annular members of elastic electrically insulating material is positioned around a corresponding one of the open sides and interposed between a corresponding end of each of the first and second arms of the holder and a corresponding one of the contact members. Each of the annular members seals the enclosure formed by the holder and the contact members and has specific dimensions which position the second electrical contact surface of each of the semiconductor cells in a determined relation with the contact surface of the corresponding one of the contact members. The annular members maintain the holder in coaxial relation with the contact members. An electrically conductive terminal prong extends from the holder outside the modular unit.

Each side of the central arm may be of convex configuration relative to the first electrical contact surface of each of the semiconductor cells and the first electrical contact surface of each of the semiconductor cells may be of planar or concave configuration relative to the corresponding side of the central arm. Each side of the central arm then has a radius of curvature and the first electrical contact surface of each of the semiconductor cells has a radius of curvature larger than that of the corresponding side of the central arm. The second electrical contact surface of each of the semiconductor cells may be of convex, planar or configuration. The first electrical contact surface of each of the semiconductor cells may be of convex configuration relative to the corresponding side of the central arm and each side of the central arm may be planar or concave configuration relative to the first electrical contact surface of each of the semiconductor cells. The first electrical contact surface of each of the semiconductor cells then has a radius of curvature and each side of the central arm has a radius of curvature larger than that of the first electrocal contact surface of the corresponding one of the semiconductor cells.

The holder may comprise a plurality of holders positioned in spaced relation with their axes substantially parallel to each other and the pair of contact members. Each of the holders and the contact members encloses a pair of the semiconductor cells. One of the contact members comprises resilient material insulatedly affixed to the other of the contact members at at least two points. Insulating spacers are provided. Each insulating spacer has a length dimension corresponding to the axial dimension of each of the holders extending from the second electrical contact surface of one of the semiconductor cells to the second electrical contact surface of the other of the semiconductor cells. The length dimension of each of the insulating spacers is substantially shorter than the corresponding axial dimension of each of the holders to enable the application of optimum contact pressure in the assembly of the modulator unit. One of the contact members comprises a component of the bearing plate of a generator. Each of the contact members is of annular segment configuration and each of the holders is positioned in a common circular arc. The axis of the central arm of each of the holders is substantially perpendicular to and intersects the common circular arc.

In order that the present invention may be readily carried into effect, it will now be described with reference to the accompanying drawing, wherein.

In the figures, the same components are identified by the same reference numerals.

Figures 1, 2, 3, 4, 5, 6:
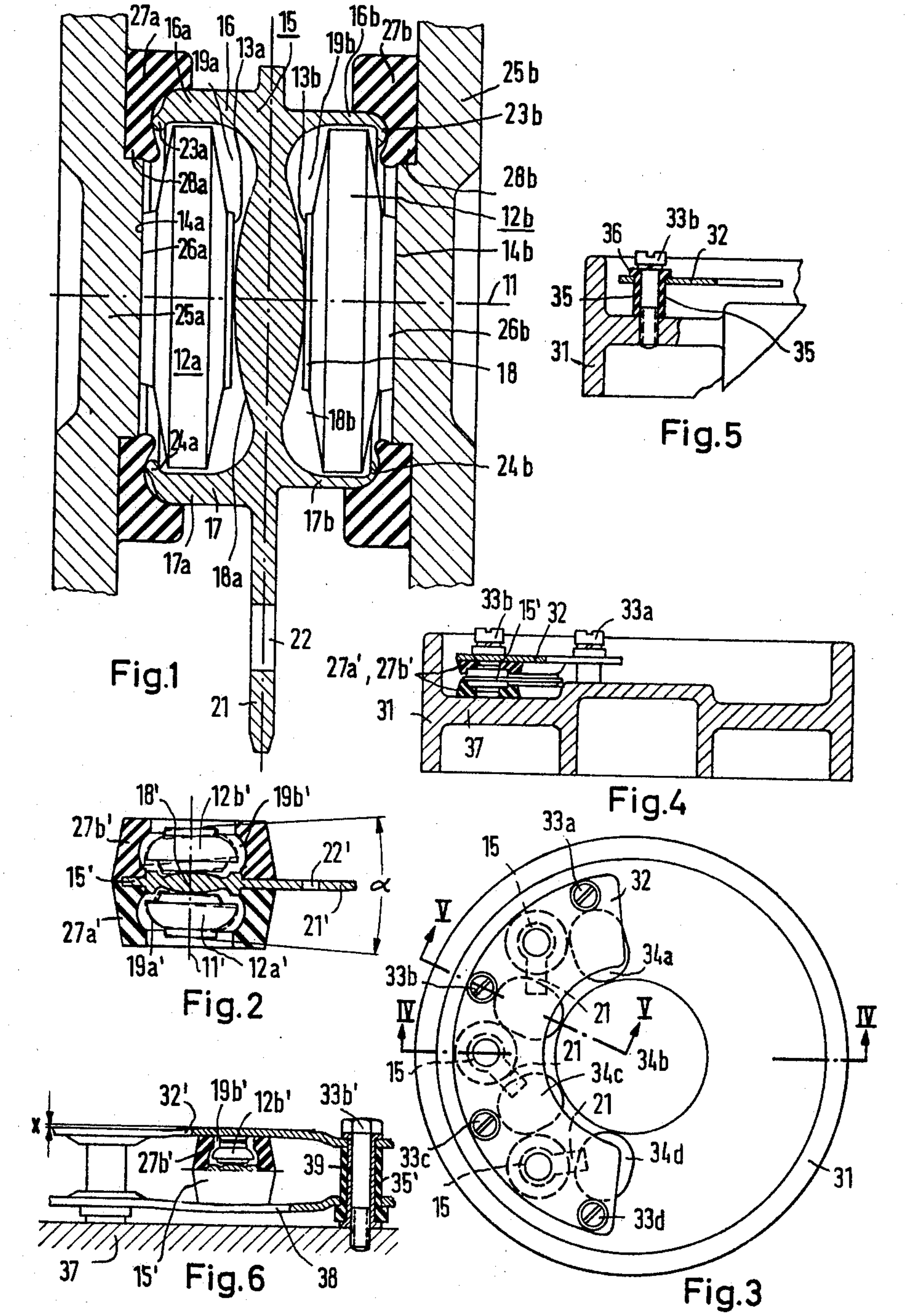
FIG. 1 is a sectional view of an embodiment of a modular unit of the present invention.
FIG. 2 is a view, partly in section, of another embodiment of the modular unit of the present invention.
FIG. 3 is a view of a modular unit of the present invention which comprises a plurality of modular units of the type of FIG. 1 or FIG. 1.
FIG. 4 is a view, partly in section, taken along the lines IV—IV of FIG. 3.
FIG. 5 is a view, partly in section, taken along the lines V—V of FIG. 3.
FIG. 6 is a view, partly in section, of the modular unit of FIG. 2 mounted on the bearing plate of an electrical machine.

FIG. 1 illustrates the symmetrical configuration of the modular unit of the present invention about an axis 11. The modular unit of FIG. 1 houses a pair of semiconductor cells **12*a* and 12*b* which are identical with each other. The first semiconductor cell 12*a* has a first electrical contact surface 13*a* and a second electrical contact surface 14*a* which is spaced from and substantially parallel to said first electrical contact surface. The second semiconductor cell has a first electrical contact surface 13*b* and a second electrical contact surface 14*b*** which is spaced from and substantially parallel to said first electrical contact surface.

The modular unit of FIG. 1 comprises a holder 15 of electrically conductive material such as, for example, metal. The holder 15 is of substantially H-shaped cross section having a first arm 16 and a second arm 17. The first and second arms 16 and 17 are spaced from and substantially parallel to each other. In the configuration of FIG. 1, the surface of the first and second arms 16 and 17 closest to the axis 11 are equidistantly spaced from each other, although the surfaces away from said axis vary in their distances from said axis. The holder 15 also comprises a central arm 18.

The central arm 18 of the holder 15 extends between and is joined to the center area of each of the first and second arms 16 and 17 and is substantially perpendicular to said first and second arms. The axis 11 of the modular unit extends through the center of the central arm 18 and is parallel to and equidistant from the first and second arms 16 and 17. The central arm 18 and approximately one half **16*a* and approximately one half 17*a* enclose three sides of a first area 19*a* on one side of said central arm. The central arm 18 and approximately the other half 16*b* of the first arm and approximately the other half 17*b* of the second arm enclose three sides of a second area 19*b*** on the other side of said central arm.

The first area **19*a* houses the first semiconductor cell 12*a* in substantially coaxial relation with the first electrical contact surface 13*a* of said first semiconductor cell in electrical contact with a first side 18a of the central arm 18. The second area 19b houses the second semiconductor cell 12b in substantially coaxial relation with the first electrical contact surface 13b of said second semiconductor cell in electrical contact with a second side 18b of the central arm 18. Each of the first and second areas 19a and 19b has dimensions which are slightly greater than the corresponding dimensions of the semiconductor cells 12a and 12b, respectively. An exception is that the axial dimension of each of the first and second semiconductor cells 12 and 12b is greater than the axial dimension of the first and second areas 19a and 19b**, respectively.

The second electrical contact surface 14a of the first semiconductor cell 12a is positioned outside the first area 19a and the second electrical contact surface 14b of the second semiconductor cell 12b is positioned outside the second area 19b. The corresponding dimensions of the first semiconductor cell 12a and the first area 19a and the corresponding dimensions of the second semiconductor cell 12b of the second area 19b are related to each other in a manner whereby said first semiconductor cell is freely shiftable or movable out of coaxial position in said first area in a predetermined range of movement and said second semiconductor cell is freely shiftable out of coaxial position in said second area in a predetermined range of movement. The shifting of the semiconductor cells is somewhat indicated in FIG. 2 by the broken lines around such cells.

The holder 15 is an integral unit comprising the first, second and central arms 16, 17 and 18. The material of the holder 15 is a good conductor of heat as well as electricity and comprises, for example, copper. A terminal prong 21 extends from the holder 15 to a position outside the modular unit. The terminal prong 21 may be integrally formed with the holder 15 and may extend from the central arm 18 at one end thereof, as shown in FIG. 1. The terminal prong 21 has an aperture 22 formed therethrough for the purpose of facilitating electrical connection to an outside electrical conductor or the like.

The first side 18a and the second side 18b of the central arm 18 are each of convex configuration relative to the corresponding first electrical contact surfaces 13a and 13b of the first and second semiconductor cells 12a and 12b, respectively. In a preferred embodiment of the modular unit of FIG. 1, the first and second sides 18a and 18b of the central arm 18 are of spherical configuration relative to the corresponding first and second electrical contact surfaces 13a and 13b. The first arm 16 of the holder 15 may be provided with bent over or flanged edges 23a and 23b and the second arm 17 of said holder may be provided with bent over or flanged edges 24a and 24b. The flanged edges 23a and 24a prevent the first semiconductor cell 12a from falling out of the first area 19a and the flanged edges 23b and 24b prevent the second semiconductor cell 12b from falling out of the second area 19b.

A first electrically conductive contact member 25a is provided in coaxial relation with the holder 15 and has a contact surface 26a in electrical contact with the second electrical contact surface 14a of the first semiconductor cell 12a. A second electrically conductive contact member 25b is provided in coaxial relation with the holder 15 and has a contact surface 26b in electrical contact with the second electrical contact surface 14b of the second semiconductor cell 12b. The first and second contact members 25a and 25b clamp the holder 15 between them and function to enclose said holder between them. The electrical contact between each of the contact members 25a and 25b and the first and second semiconductor cells 12a and 12b, respectively, is facilitated by the extending of the second electrical contact surfaces 14a and 14b of said semiconductor cells outside the corresponding first and second areas 19a and 19b, respectively. The open side of the first area 19a through which the second electrical contact surface 14a of the first semiconductor cell 12a extends, is smaller in area than the corresponding side of said semiconductor cell, but larger in area than the contact surface 26a of the first contact member 25a. The open side of the second area 19b through which the second electrical contact surface 14b of the second semiconductor cell 12b extends, is smaller in area than the corresponding side of said semiconductor cell, but is larger in area than the contact surface 26b of the second contact member 25b.

A first annular member 27a of elastic material which is an electrical insulator such as, for example, rubber or rubber-like elastic synthetic material such as neoprene or Perbunan, is interposed between the corresponding end 23a of the first arm of the corresponding end 24a of the second arm of the holder and the first contact member 25a. A second annular member 27b of elastic material which is an elastic insulator such as, for example, rubber or rubber-like elastic synthetic material such as neoprene or Perbunan, is interposed between the corresponding end 23b of the first arm and the corresponding end 24b of the second arm of the holder of the second contact member 25b. The first annular member 27a is thus positioned around the open side of the first area 19a and the second annular member 27b is positioned around the open side of the second area 19b.

The first and second annular members 27a and 27b function as sealing members for sealing rings and seal the enclosure formed by the holder 15 and the first and second contact members 25a and 25b. The dimensions of each of the first and second sealing members 27a and 27b are such that the contact surface 26a of the first contact member 25a is in a desired relation with the second electrical contact surface 14a of the first semiconductor cell 12a and the contact surface 26b of the second contact member 25b is in a desired relation with the second electrical contact surface 14b of the second semiconductor cell 12b. The first contact member 25a may be formed with a shoulder 28a and the second contact member 25b may be formed with a shoulder 28b. The first sealing member 27a may be supported on or affixed to the shoulder 28a of the first contact member 25a and the second sealing member 27b may be supported on or affixed to the shoulder 28b of the second contact member 25b. The first sealing member 27a may also be supported on or affixed to the half portion 16a of the first arm and the half portion 17a of the second arm of the holder 15 and the second sealing member 27b may also be supported on or affixed to the half portion 16b of the first arm and the half portion 17b of the second arm of said holder. The first and second sealing members 27a and 27b maintain the holder 15 in coaxial relation with the first and second contact members 25a and 25b and thereby maintain the electrical contact between said contact members and the first and second semiconductor cells 12a and 12b. As soon as the first and second contact members 25a and 25b have been positioned to clamp the holder 15 and the sealing members 27a and 27b between them, said sealing members completely seal the first and second areas 19a and 19b against the atmosphere.

Although the sides of the central arm 18 of the holder 15 of the embodiment of FIG. 1 are shown as being of convex configuration, any suitable arrangement whereby one or more of the sides 18a and 18b, the first electrical contact surfaces 13a and 13b, the second electrical contact surfaces 14a and 14b and the contact surfaces 26a and 26b may be of convex or spherical configuration, the other cooperating surfaces being of substantially planar or concave configuration. The first electrical contact surfaces 13a and 13b of the first and second semiconductor cells 12a and 12b each have a radius of curvature larger than that of the first and second sides 18a and 18b of the central arm 18 when said sides are of convex configuration relative to said electrical contact surfaces. The sides 18_a_ and 18_b_ of the central arm 18 have a radius of curvature which is greater than that of the first electrical contact surfaces 13_a_ and 13_b_ of the first and second semiconductor cells 12_a_ and 12_b_ when said first electrical contact surfaces are of convex configuration relative to said sides and said sides are of either planar or concave configuration relative to said first electrical contact surfaces.

In the embodiment of FIG. 1, the contact surfaces 26_a_ and 26_b_ of the first and second contact members 25_a_ and 25_b_, respectively, are parallel to each other. The structure of the modular unit of the present invention permits the first and second contact members 25_a_ and 25_b_ to be positioned at an angle between each other, as indicated in FIG. 2. In the embodiment of FIG. 2, the first and second arms 16 and 17 are shortened to the extent that they are practically non-existent. The principal configuration of the holder 15' is thus that of the central arm 18'. In FIG. 2, the central arm 18' and the terminal prong 21' are of electrical and heat conductive material, as the equivalent portions of the embodiment of FIG. 1 and the first and second sealing members 27_a'_ and 27_b'_ are of the same material as the corresponding sealing members 27_a_ and 27_b_ of the embodiment of FIG. 1.

The sealing members 27_a'_ and 27_b'_ of the embodiment of FIG. 2 extend for greater axial distances than the corresponding dimensions of the first and second semiconductor cells 12_a'_ and 12_b'_, so that said sealing members function to seal the first and second areas 19_a'_ and 19_b'_ against the atmosphere when the holder 15' and said sealing members are clamped between first and second contact members (not shown in FIG. 2). The first and second semiconductor cells 12_a'_ and 12_b'_ are shown in non-coaxial positions by the broken lines in FIG. 2 and are at an angle $\alpha$ with each other in the broken line positions. The first and second contact members (not shown in FIG. 2) may be maintained with their contact surfaces at an angle with each other rather than parallel, as shown in FIG. 1.

FIG. 3 is a top view of a bearing plate 31 of an electrical machine or electrical generator with three holders 15 of the type of FIG. 1 clamped between said bearing plate and a contact member 32. The bearing plate 31 functions as the first contact member and the contact member 32 is the second contact member. The first and second contact members 31 and 32 are affixed to each other at four equidistantly spaced points by any suitable means such as, for example, bolts or screws 33_a_, 33_b_, 33_c_ and 33_d_. The bolts 33_a_, 33_b_, 33_c_ and 33_d_ are spaced with a corresponding one of the holders 15 positioned between each pair of adjacent bolts equidistantly from each of said adjacent bolts. The four bolts 33_a_, 33_b_, 33_c_ and 33_d_ are positioned on a circular arc passing through their centers. The three holders 15 are positioned on another circular arc having a smaller radius than that of the arc upon which the bolts are positioned. The axis (not shown in FIG. 3) of each of the holders 15 is perpendicular to and intersects the common circular arc upon which said holders are positioned. The first and second contact members 31 and 32 are of annular segment configuration. The first and second contact members 31 and 32 are positioned equidistantly from each other in spaced parallel relation.

The bearing plate 31 has a plurality of apertures 34_a_, 34_b_, 34_c_ and 34_d_ formed therethrough to permit the free flow of air for cooling purposes and to permit access to the terminal prongs 21 of the holders 15. The modular unit of FIG. 3, comprising the three holders 15, equidistantly spaced from each other with their axes parallel to each other, functions as a three phase rectifier bridge when the first and second semiconductor cells supported by each of the holders are so positioned that the anode of one of said semiconductor cells is in electrical contact with one side of the central arm of the holder and the cathode of the other of said semiconductor cells is in electrical contact with the other side of said central arm.

The second contact member 32 preferably comprises resilient material in substantially sheet or plate form which is insulatedly affixed to the bearing plate 31 via the bolts 33_a_ to 33_d_. The second contact member 32 simultaneously functions as a clamp, a cooling member and an electrical conductor. The bearing plate 31, which functions as the first contact member also simultaneously functions as a clamp, a cooling member and an electrical conductor and may be, and usually is, additionally cooled by ventilating means inside the electrical machine.

The specific devices for affixing the first and second contact members 31 and 32 to each other in the manner of FIG. 3 are shown in detail in FIGS. 4 and 5. In FIGS. 4 and 5, each of the bolts or screws such as, for example, the bolt 33_b_, passes through an insulating spacer 35 which maintains electrical isolation between the first and second contact members 31 and 32. As seen in FIG. 5, each insulating spacer 35 has a flanged top 36 and has the general configuration of a short length, narrow diameter tube somewhat similar to a hollow rivet.

Each of the insulating spacers 35 has an axial length or length dimension which corresponds and is parallel to the axial dimension of the holders 15 and extends from the first contact member 31 to the second contact member 32. The length of each of the insulating spacers 35 is sufficiently shorter than the corresponding axial dimension of the holders 15. This enables suitable adjustment of the contact pressure between the contact members and the semiconductor cells. It thus enables the application of optimum contact pressure in the assembly of the modular unit of FIG. 3. In FIG. 4, a portion or segment 37 of the bearing plate 31 serves as the first contact member.

In FIG. 6 the portion or segment 37 of the bearing plate 31 does not function directly as the first contact member, but rather supports a first contact member 38 as well as the second contact member 32' in spaced, substantially parallel, electrically isolated or insulated relation. A single holder 15' is indicated as being clamped between the first and second contact members 38 and 32'. An insulating spacer 35' surrounds a bolt 33_b'_ which affixes the first and second contact members 38 and 32' in spaced relation to each other and to the portion 37 of the bearing plate 31. A hollow rivet 39 is interposed between the bolt 33_b'_ and the insulating spacer 35'.

FIG. 6 illustrates clearly the sealing to the atmosphere of the first and second areas 19_a'_ (not shown in FIG. 6) and 19_b'_ by the sealing members 27_a'_ (not shown in FIG. 6) and 27_b'_ and the action of the clamping first and second contact members 38 and 32'. A range of movement X of the second contact member 32' is indicated in FIG. 6. The range of movement X results from the distance between the first and second contact members 38 and 32' being less at the fastening point of the bolt 33_b'_ than the distance between said first and second contact members at the point of clamping of the holder 15'.

In order to improve the heat and current transfer at the electrical contacts in the modular unit of the present invention, an intermediate layer of ductile material such as, for example, silver, may be interposed between corresponding abutting electrical contacts.

While the invention has been described by means of specific examples embodiments, I do not wish to be limited thereto, for obvious modifications will occur to those skilled in the art without departing from the spirit and scope of the invention.

I claim:

1. A modular unit for applying pressure between a pair of electrical contacts and a pair of substantially identical semiconductor cells, a first and a second electrical contact surface spaced from and substantially parallel to each other, said modular unit comprising electrically conductive holding means of substantially H-shaped cross section having a first arm and a second arm spaced from and substantially parallel to each other and a central arm extending between and joined to the central area of each of said first and second arms and substantially perpendicular thereto, said central arm having an axis through its center parallel to and equidistant from said first and second arms, said central arm and substantially one-half of each of said first and second arms enclosing three sides of a first area on one side of said central arm and said central arm and substantially the other half of each of said first and second arms enclosing three sides of a second area on the other side of said central arm, each of said first and second areas housing a corresponding one of said pair of semiconductor cells in substantially coaxial relation with the first electrical contact surface of each of said semiconductor cells in electrical contact with a corresponding one of the sides of said central arm, and said areas having dimensions, lateral to said axis, slightly greater than the corresponding dimensions of each of said semiconductor cells and slightly less than the dimension of each semiconductor cell, in the direction of said axis, the second electrical contact surface of each of said semiconductor cells being positioned respectively outside said first and second areas, said semiconductor cells being movable from positions in planes perpendicular to said axis into planes slightly inclined relative thereto whereby said semiconductor cells are freely shiftable out of coaxial position in the corresponding first and second areas in a predetermined range of movement; and a pair of electrically conductive contact members in substantially coaxial relation with, and clamping, and enclosing said holding means between them, and each of said contact members having a contact surface electrically contacting the second electrical contact surface of a corresponding one of said semiconductor cells.

2. A modular unit as claimed in claim 1, wherein the open side of each of said first and second areas is smaller in area than the corresponding side of the semiconductor cell and larger in area than the corresponding contact surface of the contact member.

3. A modular unit as claimed in claim 1, wherein one of a side of said central arm and a contact surface of each of said contact members is of convex configuration relative to the electrical contact surface of the corresponding semiconductor cell.

4. A modular unit as claimed in claim 1, wherein one of a side of said central arm and a contact surface of each of said contact members is of substantially spherical configuration relative to the electrical contact surface of the corresponding semiconductor cell.

5. A modular unit as claimed in claim 2, further comprising a pair of substantially annular members of elastic electrically insulating material each positioned around a corresponding one of said open sides and interposed between a corresponding end of each of the first and second arms of said holding means and a corresponding one of said contact members.

6. A modular unit as claimed in claim 3, further comprising a pair of substantially annular members of elastic electrically insulating material each interposed between a corresponding end of each of the first and second arms of said holding means and a corresponding one of said contact members.

7. A modular unit as claimed in claim 3, wherein the ends of the first and second arms of said holding means are bent in a manner whereby they extend toward each other for a small distance substantially parallel to the central arm of said holding means.

8. A modular unit as claimed in claim 3, wherein the second electrical contact surface of each of said semiconductor cells is outside the corresponding one of said first and second areas.

9. A modular unit as claimed in claim 3, further comprising an electrically conductive terminal prong extending from said holding means outside said modular unit.

10. A modular unit as claimed in claim 3, wherein each side of said central arm is of convex configuration relative to the first electrical contact surface of each of said semiconductor cells and said first electrical contact surface of each of said semiconductor cells is of one of planar and concave configuration relative to the corresponding side of said central arm.

11. A modular unit as claimed in claim 3, wherein the second electrical contact surface of each of said semiconductor cells is of one of convex, planar and concave configuration.

12. A modular unit as claimed in claim 3, wherein the first electrical contact surface of each of said semiconductor cells is of convex configuration relative to the corresponding side of said central arm and each side of said central arm is of one of planar and concave configuration relative to the first electrical contact surface of each of said semiconductor cells.

13. A modular unit as claimed in claim 3, wherein said holding means comprises a plurality of said holding means positioned in spaced relation with their axes substantially parallel to each other and said pair of contact members, each of said holding means and said contact members enclosing a pair of said semiconductor cells.

14. A modular unit as claimed in claim 5, wherein each of said annular members seals the enclosure formed by said holding means and said contact members and has specific dimensions which position the second electrical contact surface of each of said semiconductor cells in a determined relation with the contact surface of the corresponding one of said contact members.

15. A modular unit as claimed in claim 10, wherein each side of said central arm has a radius of curvature and the first electrical contact surface of each of said semiconductor cells has a radius of curvature larger than that of the corresponding side of said central arm.

16. A modular unit as claimed in claim 12, wherein the first electrical contact surface of each of said semiconductor cells has a radius of curvature and each side of said central arm has a radius of curvature larger than that of the first electrical contact surface of the corresponding one of said semiconductor cells.

17. A modular unit as claimed in claim 13, wherein one of said contact members comprises resilient material insulatedly affixed to the other of said contact members at at least two points.

18. A modular unit as claimed in claim 14, wherein said annular members maintain said holding means in coaxial relation with said contact members.

19. A modular unit as claimed in claim 17, further comprising insulating spacers each having a length dimension corresponding to the axial dimension of each of said holding means extending from the second electrical contact surface of one of said semiconductor cells to the second electrical contact surface of the other of said semiconductor cells, the length dimension of each of said insulating spacers being substantially shorter than the corresponding axial dimension of each of said holding means to enable the application of optimum contact pressure in the assembly of said modular unit.

20. A modular unit as claimed in claim 17, further comprising a generator having a bearing plate and wherein said one of said contact members comprises a component of the bearing plate of said generator.

21. A modular unit as claimed in claim 17, wherein each of said contact members is of annular segment configuration and wherein each of said holding means is positioned in a common circular arc.

22. A modular unit as claimed in claim 21, wherein the axis of the central arm of each of said holding means is substantially perpendicular to and intersects said common circular arc.

References Cited

UNITED STATES PATENTS

| | | | |
|---|---|---|---|
| 3,160,771 | 12/1964 | Martin et al. | 317—234 X |
| 3,183,407 | 5/1965 | Vasuda et al. | 317—101 |
| 3,226,466 | 12/1965 | Martin | 317—234 X |
| 3,238,425 | 3/1966 | Geyer | 317—234 |
| 3,280,389 | 10/1966 | Martin | 317—234 |

JAMES D. KALLAM, Primary Examiner

U.S. Cl. X.R.

317—235